(12) United States Patent
Furuyama et al.

(10) Patent No.: US 8,727,844 B2
(45) Date of Patent: May 20, 2014

(54) VENTILATION MEMBER AND METHOD OF MANUFACTURING THE SAME

(75) Inventors: Satoru Furuyama, Osaka (JP); Kouji Furuuchi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 845 days.

(21) Appl. No.: 12/675,926

(22) PCT Filed: Sep. 4, 2008

(86) PCT No.: PCT/JP2008/066003
§ 371 (c)(1),
(2), (4) Date: Mar. 1, 2010

(87) PCT Pub. No.: WO2009/031628
PCT Pub. Date: Mar. 12, 2009

(65) Prior Publication Data
US 2010/0221995 A1    Sep. 2, 2010

(30) Foreign Application Priority Data
Sep. 4, 2007   (JP) .................................. 2007-229417

(51) Int. Cl.
*F24F 7/00*      (2006.01)
(52) U.S. Cl.
USPC .......................................... 454/284; 55/385.4
(58) Field of Classification Search
USPC ......................................................... 454/284
See application file for complete search history.

(56) References Cited

U.S. PATENT DOCUMENTS

| | | | | |
|---|---|---|---|---|
| 3,495,463 A | * | 2/1970 | Howell | 73/863.12 |
| 3,750,665 A | * | 8/1973 | Stranicky | 128/206.12 |
| 4,604,090 A | * | 8/1986 | Reinicke | 604/118 |
| 4,900,380 A | * | 2/1990 | Matsuzawa | 156/73.1 |
| 5,988,426 A | * | 11/1999 | Stern | 220/371 |
| 7,255,354 B2 | * | 8/2007 | Tamura et al. | 277/650 |
| 7,401,633 B2 | * | 7/2008 | Hatano | 156/358 |
| 2007/0125247 A1 | * | 6/2007 | Kunstmann et al. | 101/170 |
| 2007/0231305 A1 | * | 10/2007 | Noll et al. | 424/93.7 |
| 2007/0299525 A1 | * | 12/2007 | Binotto | 623/17.16 |
| 2009/0047890 A1 | * | 2/2009 | Yano et al. | 454/143 |
| 2010/0227543 A1 | * | 9/2010 | Furuyama | 454/270 |

FOREIGN PATENT DOCUMENTS

| | | |
|---|---|---|
| JP | 2001-001404 A | 1/2001 |
| JP | 2003-063549 A | 3/2003 |
| JP | 2004-249653 A | 9/2004 |
| JP | 2004-358746 A | 12/2004 |
| JP | 2007-007971 | 1/2007 |
| JP | 2007-141629 A | 6/2007 |

* cited by examiner

*Primary Examiner* — Steven B McAllister
*Assistant Examiner* — Frances H Kamps
(74) *Attorney, Agent, or Firm* — Hamre, Schumann, Mueller & Larson, P.C.

(57) ABSTRACT

A ventilation member 13 includes a gas-permeable sheet 6 and a support body 11 in which a through-hole 11*h* is formed. One opening of the through-hole 11*h* is closed by the sheet 6. As a face to which the sheet 6 is to be attached, the support body 11 has a ring-shaped opening end face 12 parallel to the in-plane direction of the sheet 6. In an outer peripheral region 12*j* of the opening end face 12, the sheet 6 is welded to the support body 11, forming a ring-shaped welded portion 15. The sheet 6 is not welded to the support body 11 in an inner peripheral region 12*k* of the opening end face 12. The inner peripheral region 12*k* is surrounded by the welded portion 15.

14 Claims, 7 Drawing Sheets

VENTILATION MEMBER AND METHOD OF MANUFACTURING THE SAME

TECHNICAL FIELD

The present invention relates to a ventilation member and a method of manufacturing the same.

BACKGROUND ART

Housings for automotive electrical components have been made to provide a function (an internal pressure regulating function) of preventing the housing breakage due to the rise of the internal pressure by eliminating the differential pressure between the interior and the exterior of the housing. A ventilation member using a porous membrane is known as a ventilation member giving such a function to the housing. For example, ventilation members (it is called "air permeable plug" in JP 2003-063549 A) disclosed in JP 2003-063549 A, JP 2004-358746 A, and JP 2004-249653 A include a cylindrical main body as a support body and include a porous membrane bonded to the main body by insert molding.

Generally, the capability of the above-mentioned ventilation member to eliminate the differential pressure is depending on the gas permeability of the porous membrane and the size of the porous membrane. Therefore, in order to enhance the capability to eliminate the differential pressure, one may enlarge the area of the porous membrane or may improve the gas permeability of the porous membrane.

However, the gas permeability of the porous membrane already has reached a level in which it is difficult to find room for improvement. On the other hand, the enlargement of the area of the porous membrane cannot be adopted easily because it deteriorates the dust/water-proof performance of the ventilation member. In recent years, restrictions on the size of the ventilation member have become severe with the miniaturization of the housing that should have the internal pressure regulating function.

The insert molding disclosed in JP 2003-063549 A can improve the bonding strength between the porous membrane and the main body. In insert molding, as shown in FIG. 11, a porous membrane 103 is positioned and fixed to a molding die 101 with check pins 102, and then resin is injected to a cavity KV. Therefore, it is difficult to obtain a gas-permeable area larger than the opening area of the main body. Moreover, the portion of the porous membrane 103 between the pins 102 and 102 is crushed because of the pressure of the pins 102, resulting in the loss of the gas-permeation function. As a result, the gas-permeable area in some cases becomes smaller than the opening area of the main body.

DISCLOSURE OF THE INVENTION

With such a situation in mind, an object of the present invention is to improve the internal pressure regulating function of a ventilation member in a way other than improving the gas-permeable performance of the gas-permeable sheet or enlarging the area of the sheet.

The present invention provides a ventilation member including:

a gas-permeable sheet and a support body having a vent hole for connecting an exterior space with a space to be ventilated, the vent hole being closed by the sheet, wherein the sheet is welded to the support body in an outer peripheral region of an opening end face of the vent hole, forming a ring-shaped welded portion, the sheet is not welded to the support body in an inner peripheral region of the opening end face, the inner peripheral region being surrounded by the welded portion, and a principal plane of the sheet is in contact with the opening end face in the inner peripheral region so that the sheet is supported by the support body.

In another aspect, the present invention provides a method of manufacturing a ventilation member including a gas-permeable sheet and a support body having a vent hole that connects an exterior space with a space to be ventilated and is closed by the sheet, the method including the steps of:

providing the sheet and the support body individually;

determining a relative position of the sheet and the support body so that the vent hole is closed; and welding the sheet to the support body so that a ring-shaped welded portion between the support body and the sheet is formed in an outer peripheral region of an opening end face to which the sheet is to be attached and so that a non-bonding state between the opening end face and a principal plane of the sheet is maintained in an inner peripheral region, surrounded by the outer peripheral region, of the opening end face.

In the conventional ventilation member, as disclosed in JP 2003-063549 A, a whole region where an opening end face of a support body and a principal plane of a sheet overlap serves as a bonding area. Since the gas permeability of the sheet is lost in a portion bonded to the support body, such a portion does not contribute to the elimination of the differential pressure. Accordingly, in such a ventilation member, the opening area of a vent hole and the gas-permeable area of the sheet are equal.

On the other hand, in the ventilation member of the present invention, the welded portion between the gas-permeable sheet and the support body is formed only in the outer peripheral region of the opening end face, and the sheet is not welded to the support body in the inner peripheral region. Since the portion that is not welded has gas permeability, the substantial gas-permeable area of the sheet is larger than the opening area of the vent hole. That is, according to the present invention, the ventilation performance (capability of eliminating the differential pressure) of the ventilation member can be improved without substantially enlarging the area of the sheet. Moreover, since the improvement is not associated with the enlargement of the opening area of the vent hole, it is not necessary to sacrifice various performances such as dust/water-proof performance and resistance to water pressure.

And the above-mentioned ventilation member of the present invention can be manufactured appropriately using the method of the present invention.

BEST MODE FOR CARRYING OUT THE INVENTION

Embodiments of the present invention are described below with reference to the drawings.

Figure 1:
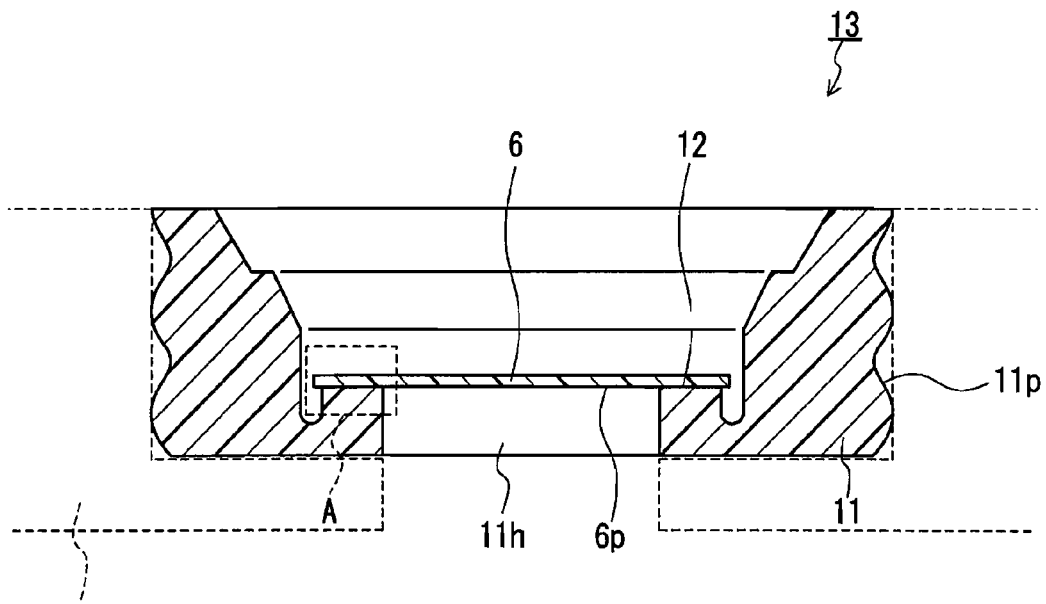
FIG. 1 shows a sectional view of a ventilation member according to an embodiment of the present invention.
Figure 5:
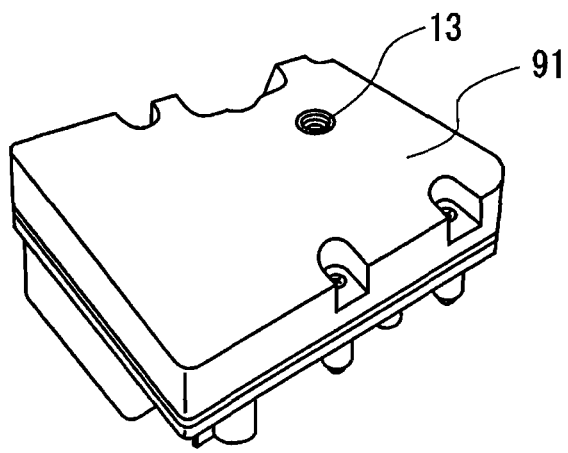
FIG. 5 shows a general view of a housing to which the ventilation member shown in FIG. 1 is attached.

FIG. 1 shows a longitudinal sectional view of a ventilation member according to an embodiment of the present invention. FIG. 5 shows a perspective view of a housing to which the ventilation member shown in FIG. 1 is attached. As shown in FIG. 5, a ventilation member 13 shown in FIG. 1 is attached to, for example, a housing 91 for an automotive electrical component.

As shown in FIG. 1, the ventilation member 13 includes a gas-permeable sheet 6 and a support body 11 in which a through-hole 11$h$ is formed. The through-hole 11$h$ penetrates the inside (central part) of the support body 11, so that it functions as a vent hole for connecting the exterior to the interior space of the housing 91 that needs ventilation. One opening of the through-hole 11$h$ is closed by the sheet 6. The other opening is connected to the interior space of the housing 91. The support body 11 has approximately cylindrical shape and has a ring-shaped opening end face 12 around the one opening of the through-hole 11$h$. The opening end face 12 is a face to which the sheet 6 is to be attached. The opening end face 12 is a plane that is parallel to the in-plane direction of the sheet 6. The center of the sheet 6 coincides with the center of the through-hole 11$h$. The diameter of the sheet 6 is larger than the outside diameter of the opening end face 12.

Figure 3:
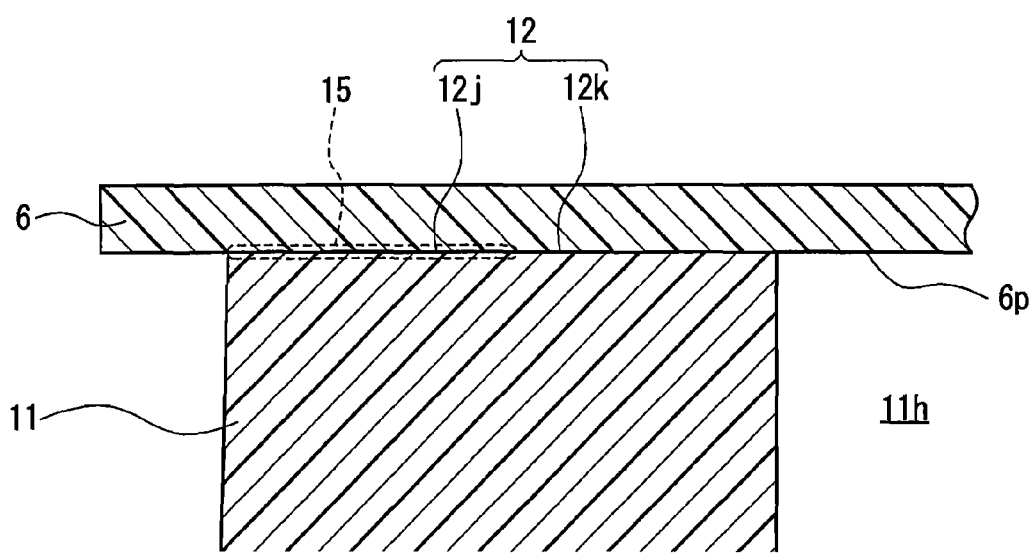
FIG. 3 shows an enlarged view of part A, surrounded by a dashed line, of the ventilation member shown in FIG. 1.

As shown in the enlarged partial view in FIG. 3, the opening end face 12 includes an outer peripheral region 12$j$ and an inner peripheral region 12$k$. The sheet 6 is welded to the support body 11 in the outer peripheral region 12$j$ of the opening end face 12. A principal plane 6$p$ of the sheet 6 and the opening end face 12 are bonded, forming a ring-shaped welded portion 15. The area of the welded portion 15 can be, for example, in the range of 5 to 20% of the whole area of the sheet 6. When the area of the welded portion 15 is in such a range, enough area for gas permeation can be ensured and the detachment of the sheet 6 from the support body 11 can be prevented. Moreover, unevenness in welding can be made small, so that defects in the waterproof properties of the welded portion 15 rarely occur.

On the other hand, in the inner peripheral region 12$k$, surrounded by the welded portion 15, of the opening end face 12, the sheet 6 is not welded to the support body 11. However, the principal plane 6$p$ of the sheet 6 is in contact with the opening end face 12 so that the sheet 6 is supported by the support body 11. Since the portion that is not welded to the support body 11 exhibits gas permeability, the substantial gas-permeable area of the sheet 6 is larger than the opening area of the through-hole 11$h$. Since the sheet 6 also is supported in the inner peripheral region 12$k$, the strength against water, small stone, and the like from the outside is not inferior to the conventional ventilation members.

The support body 11 can be fabricated using general shaping techniques, such as injection molding, compression molding, and cutting. Thermoplastic resins, such as PBT (polybutylene terephthalate), PA (nylon) and PET (polyethylene terephthalate); and thermoplastic elastomers, such as EPDM (ethylene propylene diene rubber) and silicone rubber, can be used as a material of the support body 11. In this embodiment, the support body 11 is formed of a thermoplastic elastomer. The peripheral surface of the support body 11 has concavo-convex shape 11$p$ in order to fix the ventilation member 13 to the housing 91 with the elastic force of the support body 11.

The material of the support body 11 may contain pigments, such as carbon black and a titanium white; reinforcing fillers, such as a glass particle and a glass fiber; and water-repellent materials, etc. A liquid-repellent treatment on the surface of the support body 11 makes it easy to remove a liquid (water and oil) from the surface.

A sheet having gas permeability in both the thickness direction and the in-plane direction can be employed as the sheet 6. Neither the structure nor material of the sheet 6 is particularly limited. For example, a porous membrane formed of fluororesin, such as PTFE (polytetrafluoroethylene), polychlorotrifluoroethylene, tetrafluoroethylene-hexafluoro propylene copolymer and tetrafluoroethylene-ethylene copolymer, can be used for the sheet 6. Among them, it is preferable to use a PTFE porous membrane, which is capable of ensuring a gas permeability with a small area and is capable of sufficiently preventing foreign materials from entering the housing.

Figure 2A:
FIG. 2A shows a perspective view of another example of a gas-permeable sheet.

A PTFE porous membrane may be used solely as the sheet 6. Alternatively, as shown in FIG. 2A, the sheet 6 may include a PTFE porous membrane 1 and a reinforcing member 2 integrated with the PTFE porous membrane 1. The reinforcing member 2 preferably has higher gas permeability than the PTFE porous membrane 1. For example, a woven fabric, a nonwoven fabric, a mesh, a net, a sponge, a foam or a porous body made of resin, such as polyester resin, polyethylene resin and aramid resin, can be used as the reinforcing member 2.

Figure 2B:
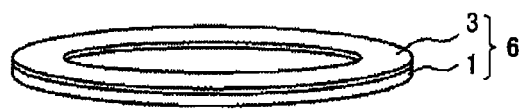
FIG. 2B shows a perspective view of yet another example of a gas-permeable sheet.

As shown in FIG. 2A, the shape of the reinforcing member 2 may be the same (for example, circle) as the PTFE porous membrane 1. Moreover, as shown in FIG. 2B, a ring-shaped reinforcing member 3 may be integrated with the PTFE porous membrane 1. The reinforcing member 2 (and 3) may be provided only on one side of the PTFE porous membrane 1 or may be provided on both sides. When the reinforcing member is provided only on one side of the PTFE porous membrane 1, the sheet 6 may be welded to the support body 11 in the direction in which the reinforcing member 2 (and 3) is in contact with the support body 11 or in the reverse direction.

The shape of the sheet 6 is generally circular. The thickness of the sheet 6 can be adjusted in the range of 1 μm to 5 mm in consideration of its strength and the ease of fixing to the support body 11. The gas permeability of the sheet 6 is preferably in the range of 0.1 to 500 sec/100 cm$^3$ when expressed as the Gurley value obtained using the Gurley method specified by JIS P 8117. The sheet 6 preferably can withstand water pressure of 1.0 KPa or more.

Figure 4:
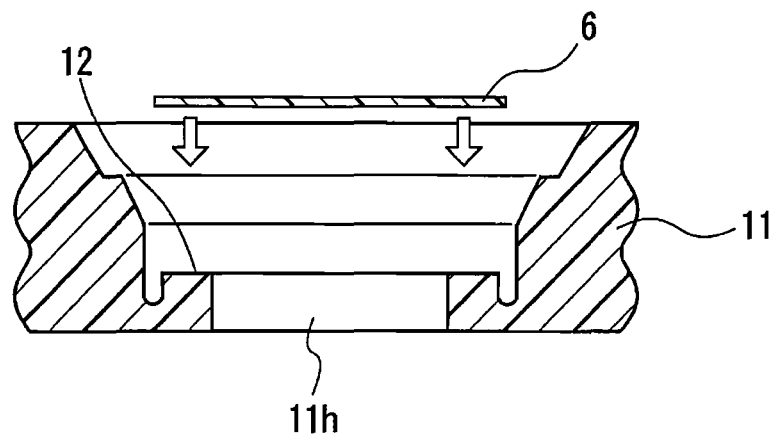
FIG. 4 shows a manufacturing process chart of the ventilation member shown in FIG. 1.
Figure 4:
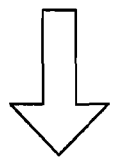
Figure 4:
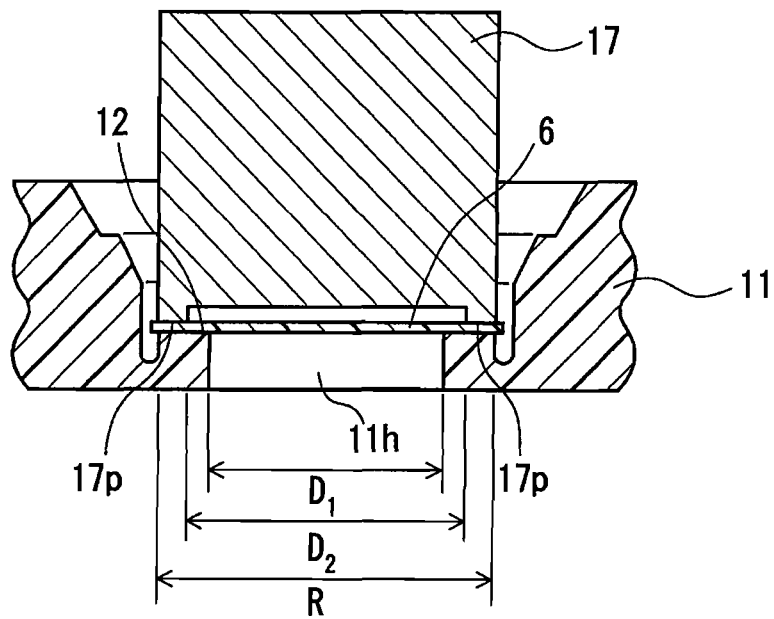

Welding of the sheet 6 to the support body 11 can be performed according to the following method. First, the sheet 6 and the support body 11 are provided (a step of providing components). Next, as shown in the upper drawing in FIG. 4, the relative position of the sheet 6 and the support body 11, which are provided individually, are determined so that one opening of the through-hole 11h is closed by the sheet 6 (a step of determining position). Specifically, the sheet 6 is put on the opening end face 12 of the support body 11 so that the center of the sheet 6 coincides with the center of the through-hole 11h. Next, as shown in the lower drawing in FIG. 4, the sheet 6 is welded to the support body 11 (a step of welding). By welding the sheet 6 to the support body 11, the ventilation member 13 shown in FIG. 1 can be fabricated.

As described above, the support body 11 has the ring-shaped opening end face 12 as a face to which the sheet 6 is to be attached. The step of welding the sheet 6 to the support body 11 can be performed so that the region where the ring-shaped welded portion 15 is formed is restricted to the outer peripheral region 12j (see FIG. 3) of the opening end face 12 and so that a non-bonding state between the opening end face 12 and the principal plane of the sheet 6 is maintained in the inner peripheral region 12k surrounded by the outer peripheral region 12j.

The method of welding the sheet 6 to the support body 11 may be heat welding, ultrasonic welding, impulse welding, or laser welding. The welding step can be performed using these methods so that the welded portion 15 is formed only in the outer peripheral region 12j of the opening end face 12. This specification shows an example in which the sheet 6 is welded to the support body 11 with a welding method using a horn 17.

The heat welding or the ultrasonic welding is preferable as a method for welding the sheet 6 to the support body 11 because those methods make it possible to perform highly precise welding easily and at low cost. The horn 17 used in the heat welding or the ultrasonic welding has, on its front end, a ring-shaped working surface 17p for applying heat to the contact surface between the support body 11 and the sheet 6. The size of the front end of the horn 17 is defined so that the whole of an inner peripheral edge of the working surface 17p is located outside of an inner peripheral edge of the opening end face 12 of the support body 11. In this embodiment, as shown in the lower drawing in FIG. 4, the inside diameter $D_2$ of the working surface 17p of the horn 17 is defined to be larger than the inside diameter $D_1$ of the through-hole 11h of the support body 11. The outside diameter R of the horn 17 is almost the same as the outside diameter of the opening end face 12. The horn 17 having these features makes it possible to form the ring-shaped welded portion 15 easily and quickly.

Moreover, the diameter of the sheet 6 is adjusted so that the outer peripheral portion of the sheet 6 protrudes slightly from the opening end face 12 of the support body 11. This makes it possible to tolerate margins of the location error occurred while welding the sheet 6 to the support body 11, so that the ring-shaped welded portion 15 can be formed surely. Moreover, since the outer peripheral edge of the opening end face 12 and the outer peripheral edge of the welded portion 15 can be coincided, the area of the welded portion 15 can be maximized. Thus, the sheet 6 and the support body 11 can be welded more firmly.

The difference ΔD between the inside diameter $D_2$ of the working surface 17p of the horn 17 and the inside diameter $D_1$ of the through-hole 11h of the support body 11 is not specifically limited. The difference ΔD is, for example, 0.2 mm or more and is preferably 1.0 mm or more. If the difference ΔD is too small, the advantageous effect of improving the ventilation performance may not be obtained. On the other hand, if the difference ΔD is too large, the welding strength between the support body 11 and the sheet 6 may be insufficient. Therefore, the upper limit for the difference ΔD may be defined so that the area of the welded portion 15 is, for example, in the range of 5 to 20% of the area of the sheet 6.

Moreover, the outside diameter R of the horn 17, the inside diameter $D_2$ of the horn 17, and the inside diameter $D_1$ of the through-hole 11h may fulfill the relationship: $1.05 \leq \{(R-D_1)/(R-D_2)\}$ and preferably fulfill the relationship: $1.2 \leq \{(R-D_1)/(R-D_2)\} \leq 10$.

Defining the size of each part according to the above-mentioned views makes it possible to fix the sheet 6 to the support body 11 firmly and to achieve sufficiently high gas permeability. The inside diameter $D_2$ of the working surface 17p is almost the same as the inside diameter of the welded portion 15, and the width of the working surface 17p is almost the same as the width of the welded portion 15.

Figure 6:
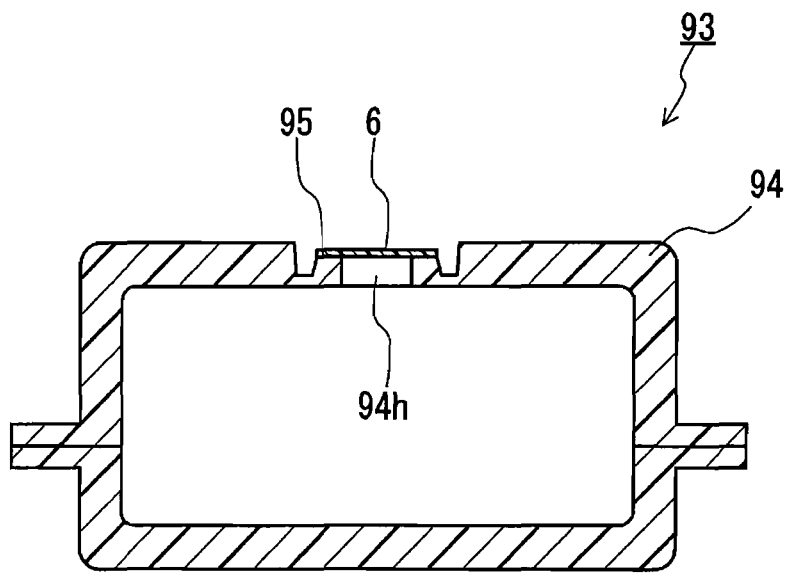
FIG. 6 shows a housing according to another embodiment of the present invention.

In the embodiment shown in FIG. 1, the ventilation member 13 and the housing 91 are separate components. However, as shown in FIG. 6, the sheet 6 may be directly welded to a housing main body 94 that is a component constituting a housing 93. In the embodiment shown in FIG. 6, the housing main body 94 functions as the support body 11 of the embodiment shown in FIG. 1. Welding of the sheet 6 to the housing main body 94 can be performed using the method mentioned above with reference to FIG. 4.

As shown in FIG. 6, the housing 93 (ventilation member) having a ventilation function includes the housing main body 94 having a vent hole 94h that connects the interior with the exterior, and the housing 93 also includes the gas-permeable sheet 6 that is directly welded to the housing main body 94. With reference to corresponding FIG. 3, in the outer peripheral region (corresponding to the outer peripheral region 12j shown in FIG. 3) of a opening end face 95 formed in the circumference of the vent hole 94h, the sheet 6 is welded to the housing main body 94, forming the ring-shaped welded portion (corresponding to the welded portion 15 shown in FIG. 3). In the inner peripheral region (corresponding to the inner peripheral region 12k shown in FIG. 3) surrounded by the welded portion, the sheet 6 is not welded to the housing main body 94, and the principal plane 6p (FIG. 3) of the sheet 6 is in contact with the opening end face 95 so that the sheet 6 is supported by the housing main body 94. Such a structure similar to the ventilation member 13 shown in FIG. 1 provides the same advantageous effect as the ventilation member 13.

Figure 7:
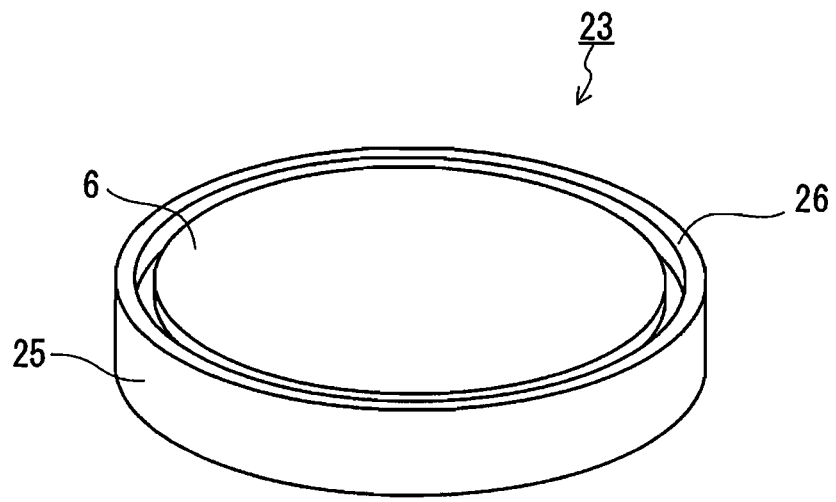
FIG. 7 shows a perspective view of a ventilation member according to yet another embodiment of the present invention.
Figure 8:
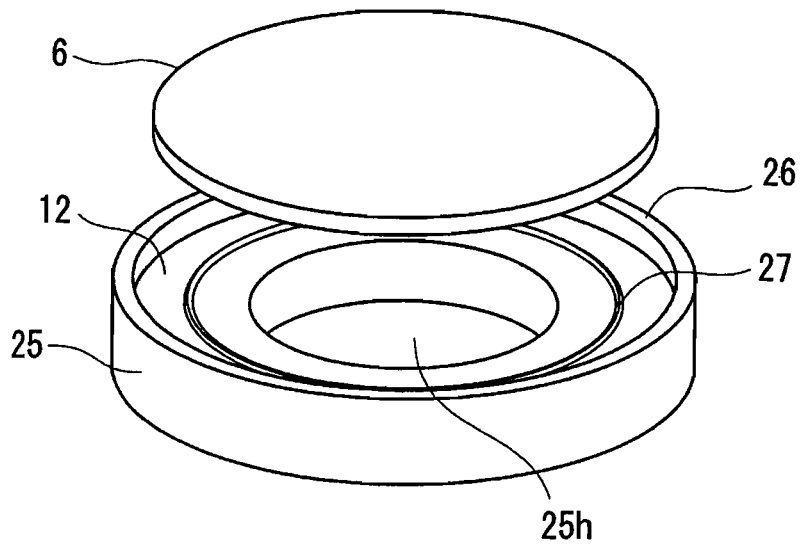
FIG. 8 shows a perspective view, before performing a welding step, of the components that constitute the ventilation member shown in FIG. 7.

Another embodiment will be described with reference to FIG. 7 and FIG. 8. FIG. 7 shows a perspective view of the ventilation member in finished form. FIG. 8 shows a perspective view of the components before performing the welding step. As well as in the embodiment described above, the ventilation member 23 of this embodiment includes the gas-permeable sheet 6 and a support body 25 having a through-hole 25h closed by the sheet 6. A ring-shaped bank portion 26 surrounding the sheet 6 is formed in the outermost part of the support body 25.

As shown in FIG. 8, before performing the step of welding, the support body 25 has a rib 27 formed in the opening end face 12 to which the sheet 6 is to be attached. The rib 27 is formed in the outer side region 12j of the opening end face 12, i.e., formed in the region in which the welded portion 15 (FIG. 9) between the sheet 6 and the support body 25 should be formed. In this embodiment, the shape of the rib 27 is a ring shape having the same center as the through-hole 25h, when viewed in plane. The rib 27 plays a role in raising the bonding strength between the support body 25 and the sheet 6.

The height of the rib 27 is not particularly limited. In order to prevent a gap between the sheet 6 and the opening end face 12 of the support body 25, the height of the rib 27, before performing the step of welding, may be in the range of, for example, 0.1 to 5 mm (preferably 0.5 to 1.5 mm). The height of the rib 27 is represented by the height from the position in which the rib 27 of the opening end face 12 is not formed.

Figure 9:
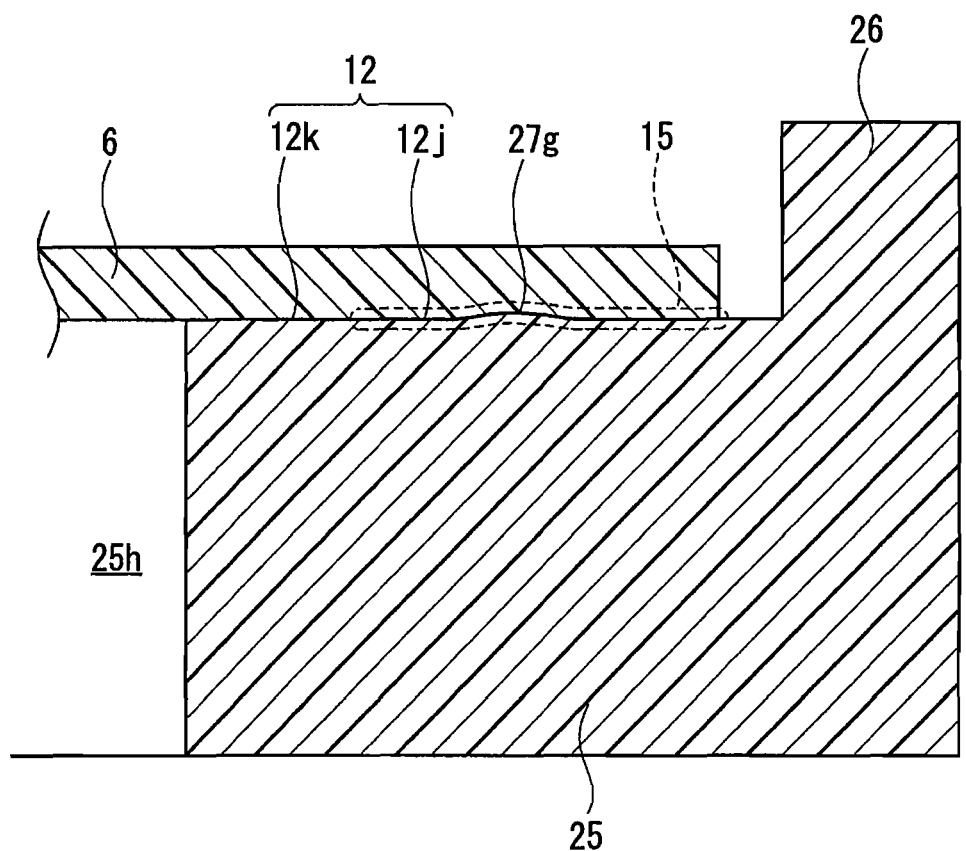
FIG. 9 shows an enlarged partial sectional view of the ventilation member shown in FIG. 7.

As shown in FIG. 9, the rib 27 melts with the heat of the welding and spreads in an in-plane direction. Accordingly, only a trace 27q of the rib 27 remains in the ventilation member 23 in finished form. The trace 27q is included in the welded portion 15 between the sheet 6 and the support body 25. In the welded portion 15, the trace 27q forms an almost flat surface or forms a surface that rises slightly from the inner peripheral region 12k in which the welded portion 15 is not formed. The welded portion 15 having high bonding strength can be formed because the resin of the rib 27 melted with the heat of welding is pushed into micropores in the sheet 6 with relatively strong power and then the melted resin becomes hard. That is, forming the rib 27 in the support body 25 before welding makes it possible to prevent the bonding strength reduction caused by forming the welded portion 15 only in the outer peripheral region 12j.

Figure 10:
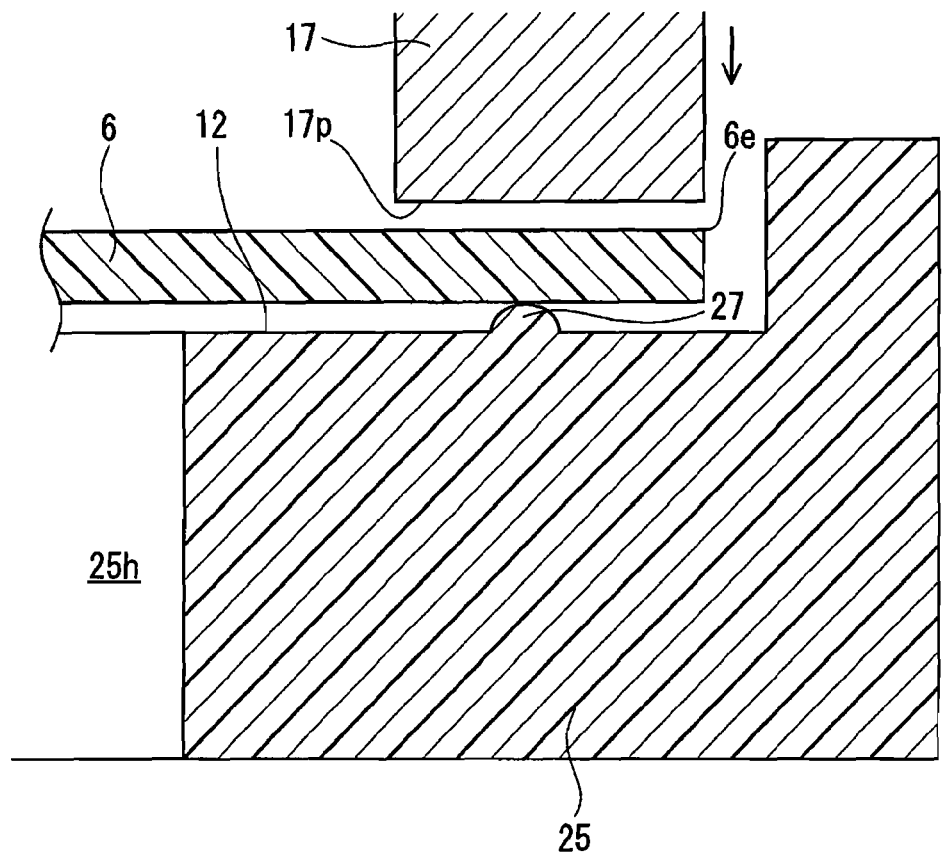
FIG. 10 is a process chart showing the welding step for manufacturing the ventilation member shown in FIG. 7.
Figure 11:
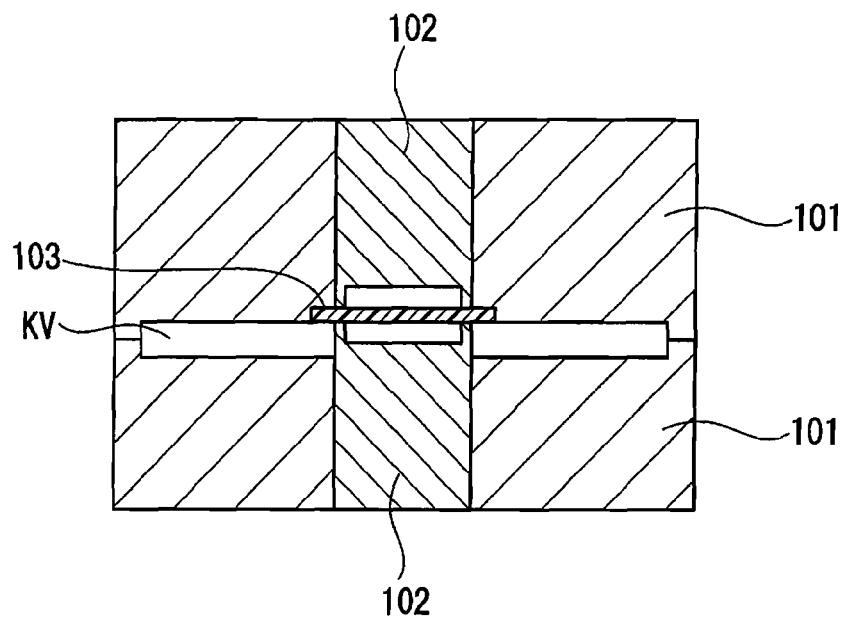
FIG. 11 is a sectional view showing a method of manufacturing a conventional ventilation member using insert molding.

As shown in FIG. 10, in the step of welding, the horn 17 is brought into contact with the sheet 6 put on the opening end face 12 of the support body 25 in such a manner that the working surface 17p straddles the rib 27 in the radial direction of the support body 25. A peripheral edge 6e of the sheet 6 is located sufficiently outside of the rib 27. The welded portion 15 shown in FIG. 9 can be formed by performing a welding step in the positional relationship shown in FIG. 10. The rib 27 may have a hemispherical section or may have rounded corners so that the sheet 6 is not damaged seriously during the welding. Moreover, a plurality of ribs 27 may be formed concentrically (preferably a double circle or a triple circle).

In part, the present invention is characterized by forming a region (inner peripheral region) where the gas-permeable sheet and the support body are not welded. In addition, the present invention also is characterized in that: using a support body having a rib formed in the opening end face that works as a welding face; bringing a welding horn into contact with a sheet in such a manner that the welding horn straddles the rib in the radial direction; and welding the sheet to the support body in such a manner that the rib melts with the heat of the welding to form an almost flat surface.

In these days, a smaller ventilation member having the same ventilation performance as the conventional one is required in response to the trend of miniaturization of various kinds of components used in, for example, automobiles. Accordingly, it is becoming difficult to ensure sufficient area for welding the sheet (a porous membrane) and the support body in some cases. If the welding area is insufficient, the problem of insufficient strength will surface. Therefore, a technique for raising the bonding strength without enlarging the size of the support body and the sheet is required. According to the above-mentioned latter characteristic of the present invention, the bonding strength can be raised without enlarging the size of the support body and the sheet. According to the above-mentioned former characteristic of the present invention, the ventilation performance also can be improved.

EXAMPLES

Example 1

A ventilation member shown in FIG. 1 was produced using the method described above with reference to FIG. 4. Heat welding was used in the welding step. The specific conditions are as follows:

Sheet: A complex of a PTFE porous membrane and a polyester nonwoven fabric (lamination conditions: load 25 N, welding temperature 270° C., welding time 1.0 second, size: 8.8 mm in diameter)

Support body: Thermoplastic elastomer (Santoprene (registered trademark) 111-73 manufactured by AES Ltd.)

Inside diameter $D_1$ of the through-hole of the support body: 6.0 mm

Inside diameter $D_2$ of the front end of a welding horn: 6.6 mm

Conditions of welding the sheet to the support body: 200° C., 0.2 MPa, 1 second

Example 2

Sheet: A complex of a PTFE porous membrane and a polyolefin nonwoven fabric (lamination conditions: load 40 N, welding temperature 170° C., welding time 1.0 second, size: 6.9 mm in diameter)

Support body: Thermoplastic elastomer (Santoprene (registered trademark) 111-73 manufactured by AES Ltd.)

Inside diameter $D_1$ of the through-hole of the support body: 4.8 mm

Inside diameter $D_2$ of the front end of a welding horn: 5.0 mm

Conditions of welding the sheet to the support body: 200° C., 0.2 MPa, 1 second

Example 3

Sheet: A complex of a PTFE porous membrane and a polyolefin nonwoven fabric (lamination conditions: load 40N, welding temperature 170° C., welding time 1.0 second, size: 13 mm in diameter)

Support body: PBT

Inside diameter $D_1$ of the through-hole of the support body: 7.5 mm

Inside diameter $D_2$ of the front end of a welding horn: 10 mm

Outside diameter R of the front end of the welding horn: 12 mm

Conditions of welding the sheet to the support body: 265° C., 0.2 MPa, 1 second

Comparative Example 1

A ventilation member was produced under the same conditions as Example 1 except that the inside diameter of the front end of the welding horn was made to be equal to the inside diameter (6.0 mm) of the through-hole of the support body.

Comparative Example 2

A ventilation member was produced under the same conditions as Example 2 except that the inside diameter of the front end of the welding horn was made to be equal to the inside diameter (4.8 mm) of the through-hole of the support body.

Comparative Example 3

The ventilation member was produced using insert molding described above with reference to FIG. 9. The same sheet as Example 3 was used. The inside diameter $D_1$ of the through-hole of the support body was also the same as Example 3, that is 7.5 mm.

(Gas Permeability Measurement)

The gas permeabilities of the ventilation members of Examples and Comparative Examples were measured using an automatic Gurley Densometer according to a method specified by JIS P 8117 (1998). The gas permeability of Example 1 was 1.15 times the gas permeability of Comparative Example 1. The gas permeability of Example 2 was 1.2 times the gas permeability of Comparative Example 2. The gas permeability of Example 3 was 1.8 times the gas permeability of Comparative Example 3.

INDUSTRIAL APPLICABILITY

The present invention is applicable to housings for automotive components, such as a lamp, a motor, a sensor, a switch, an ECU, and a gear box. Besides automotive components, the present invention is applicable to housings for electric products, such as a mobile communication equipment, a camera, an electric shaver, and an electric toothbrush.

The invention claimed is:

1. A ventilation member comprising:
a gas-permeable sheet made of resin and
a support body having a vent hole for connecting an exterior space with a space to be ventilated, the support body being made of resin, the vent hole being closed by the sheet,
wherein the sheet is welded directly to the support body in an outer peripheral region of an opening end face of the vent hole, forming a ring-shaped welded portion between the opening end face and a principal plane of the sheet,
the sheet is not welded to the support body in an inner peripheral region of the opening end face, the inner peripheral region being surrounded by the welded portion,
the principal plane of the sheet is in contact with the opening end face in the inner peripheral region so that the sheet is supported by the support body, and
the opening end face of the vent hole is orthogonal to a direction of air flow.

2. The ventilation member according to claim 1, wherein the sheet comprises a polytetrafluoroethylene porous membrane.

3. The ventilation member according to claim 2, wherein the sheet further comprises a reinforcing member that is integrated with the polytetrafluoroethylene porous membrane and has higher gas permeability than the polytetrafluoroethylene porous membrane.

4. The ventilation member according to claim 1, wherein the support body is a component that constitutes a housing, and
the space to be ventilated is an interior space of the housing.

5. A method of manufacturing a ventilation member comprising a gas-permeable sheet made of resin and a support body having a vent hole that connects an exterior space with a space to be ventilated and is covered by the sheet, the support body being made of resin, the method comprising the steps of:
providing the gas-permeable sheet and the support body individually;
determining a relative position of the sheet and the support body so that the vent hole is covered by the sheet;
welding the sheet to an opening end face of the support body directly so that a ring-shaped welded portion between the opening end face and the sheet is formed in an outer peripheral region of the opening end face to which the sheet is to be attached and so that a non-bonding support state between the opening end face and a principal plane of the sheet is maintained in an inner peripheral region of the opening end face, surrounded by the outer peripheral region of the opening end face, and
wherein the opening end face of the vent hole is orthogonal to a direction of air flow.

6. The method of manufacturing the ventilation member according to claim 5, wherein a method of welding the sheet to the support body is heat welding, ultrasonic welding, impulse welding, or laser welding.

7. The method of manufacturing the ventilation member according to claim 6, wherein
the method of welding the sheet to the support body is the heat welding or the ultrasonic welding,
a horn used in the heat welding or the ultrasonic welding has, in a front end thereof, a ring-shaped working surface for applying heat to a contact surface between the support body and the sheet, and
the size of the front end of the horn is defined so that the whole of an inner peripheral edge of the ring-shaped working surface is located outside of an inner peripheral edge of the opening end face.

8. The method of manufacturing the ventilation member according to claim 7, wherein
before performing the step of welding, the support body has a rib formed in the opening end face to which the sheet is to be attached, and
bringing the horn into contact with the sheet put on the opening end face of the support body in the step of welding in such a manner that the working surface straddles the rib in the radial direction of the support body.

9. The ventilation member according to claim 1, wherein an area of the welded portion is in the range of 5 to 20% of the whole area of the sheet.

10. The ventilation member according to claim 1, wherein the resin of the support body melted with the heat of welding is pushed into micropores in the sheet and the melted resin of the support body has become hard.

11. The ventilation member according to claim 1, wherein the sheet has waterproof performance.

12. The method of manufacturing the ventilation member according to claim 5, wherein an area of the welded portion is in the range of 5 to 20% of the whole area of the sheet.

13. The method of manufacturing the ventilation member according to claim 5, wherein the resin of the support body melted with the heat of welding is pushed into micropores in the sheet and the melted resin has become hard.

14. The method of manufacturing the ventilation member according to claim 5, wherein the sheet has water-proof performance.

* * * * *